United States Patent [19]

Aichert et al.

[11] 4,258,645
[45] Mar. 31, 1981

[54] COUPLING FOR STATIONARY AND MOVABLE VACUUM CHAMBERS

[75] Inventors: Hans Aichert, Hanau am Main; Friedrich Stark, Langenselbold; Herbert Stephan, Bruchköbel; Otto-Horst Hoffmann, Rodenbach, all of Fed. Rep. of Germany

[73] Assignee: Leybold-Heraeus GmbH, Cologne, Fed. Rep. of Germany

[21] Appl. No.: 963,060

[22] Filed: Nov. 22, 1978

[30] Foreign Application Priority Data

May 10, 1978 [DE] Fed. Rep. of Germany ....... 2820345

[51] Int. Cl.³ .............................................. C23C 13/08
[52] U.S. Cl. .................................... 118/50; 118/719; 118/733; 277/3
[58] Field of Search .......................... 118/719, 733, 50; 277/3

[56] References Cited

FOREIGN PATENT DOCUMENTS 1816055 6/1970 Fed. Rep. of Germany .

Primary Examiner—Bernard D. Pianalto
Attorney, Agent, or Firm—Sprung, Felfe, Horn, Lynch & Kramer

[57] ABSTRACT

Coupling valve for joining stationary and movable evacuatable chambers having confronting chamber walls displaced parallel with respect to each other. A first frame is fastened to one chamber wall and is joined by a resilient member to a second movable frame which can be brought into engagement with the other chamber wall. The movable frame is provided with at least one actuator by which it can be tightened against the confronting chamber wall.

5 Claims, 2 Drawing Figures

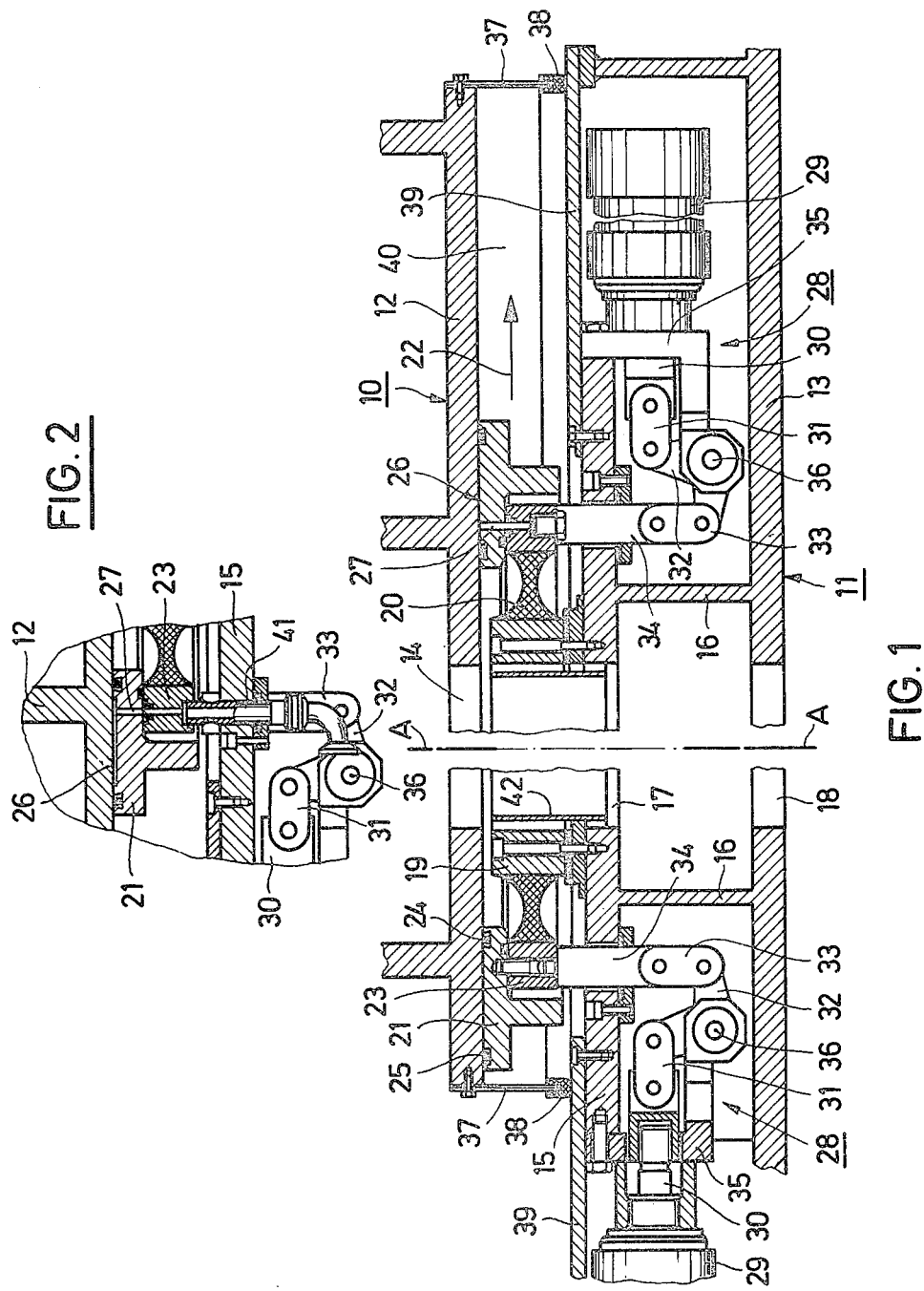

COUPLING FOR STATIONARY AND MOVABLE VACUUM CHAMBERS

BACKGROUND

This invention relates to a coupling a valve for vacuum-tight joining of stationary and movable evacuatable chambers. The valve is installed between confronting chamber walls which are displaceable parallelly against one another and includes a frame which is fastened to the one chamber wall and which is joined by a resilient member to a second movable frame which can be brought into engagement with the other chamber wall.

Coupling valves of the initially described kind are known; they serve for the vacuum-tight joining together of movable and stationary vacuum chambers which have to be separated for loading purposes, for example. For example, there are vacuum arc furnaces in which an upper part of the furnace has to be separated, (for inserting a fusible electrode), from a bottom part in which there is situated a mold for the production of a metal ingot from the material of the melted electrode. Here, however, the coupling valve plays a passive role, i.e., it serves for the compensation of any alignment errors. In this case, the movable frame is joined to the confronting chamber wall under the action of springs (German Patent No. 1 816 055). The ability of such a coupling valve to operate, however, requires that the two vacuum chambers or chamber parts that are to be joined together be additionally movable towards and away from one another, i.e., that at least one of the two vacuum chambers be provided with a drive means which enables the springs pertaining to the coupling valve to be compressed and/or relieved. Such a coupling valve, therefore, cannot be used in vacuum systems in which the distance between the two vacuum chambers or the confronting chamber walls is invariable or variable to only a very slight extent.

In vacuum systems, especially vacuum coating systems, the necessity frequently exists of bringing movable loading chambers into engagement with a stationary coating chamber. In the case of a plurality of loading chamber, this can be brought about by placing these chambers alongside one another on a carriage and enabling them to be coupled to the coating chamber successively by transverse movement. This transverse movement or shuttling requires guides such as rails and wheels, for example, which largely prevent the movable and the stationary vacuum chambers from being brought against one another. It must also be considered that two vacuum chambers which are joined together by a resilient means and evacuated are pressed against one another with a force which corresponds to the atmospheric pressure multiplied by the area of the coupling cross section of the two vacuum chambers. This force has to be absorbed by appropriate means.

SUMMARY

This invention provides a coupling valve of the initially described kind such that it can also be used for the joining of vacuum chambers whose confronting chamber walls are movable only parallel to one another.

This is achieved in accordance with the invention, in the coupling valve described above, by a movable frame that is provided with at least one actuator whereby it can be tightened against the confronting chamber wall.

DESCRIPTION

By means of the actuator, which can be a hydraulic cylinder, a magnetic actuator or a screw actuator, the coupling valve or its movable frame can be made into an active means for the production of the coupling between two vacuum chambers. Consequently, it is no longer necessary to mount at least one of the two vacuum chambers for movement or travel against the other vacuum chamber, so that the construction involved in the setting up of the one vacuum chamber and for the parallel guidance of the other vacuum chamber can be simplified. In addition, a driven frame also makes it possible to compensate to a limited extent for any misalignment or errors in the angular position of the two confronting chamber walls.

The sealing action of the movable frame against the chamber wall cooperating with it can be further improved if the movable frame has on its surface facing the confronting chamber wall at least two continuous gaskets between which there is provided an exhaust passage for the production of a vacuum. By this measure the atmospheric pressure can additionally serve for the pressing of the movable frame against the chamber wall. It will suffice in this case to bring the movable frame into engagement by means of the actuator with the chamber wall or with a sealing surface provided thereon. As soon as a vacuum is produced between the gaskets, the frame and the chamber wall will be pressed tightly together by atmospheric pressure.

The invention can be further developed to special advantage by surrounding the outer of the two frames with an additional, open frame, which spans the space between the two confronting chamber walls in a substantially sealing manner and is of such compass that it envelops the coupling valve in all possible positions of the chambers in relation to one another. Within this additional frame an inert gas atmosphere can be produced at a slight excess above the atmospheric pressure by the introduction of a dry inert gas, such as a noble gas, for example. The excess pressure prevents moisture, for example, from penetrating between the sealing surfaces of the coupling valve into the flooded valve chambers when the chambers are uncoupled and shifted, thereby interfering with the later production of the required vacuum. The inert gas atmosphere furthermore reliably prevents the penetration of dust and other foreign matter between the sealing surface.

A construction that will be especially compact longitudinally of the vacuum chambers can be achieved if the actuator is a hydraulic cylinder with piston and piston rod, if the piston rod is approximately perpendicular to the direction of movement of the movable frame, and if a bell crank is provided between the piston rod and the movable frame for the transfer of force. The additional dimensions which such a coupling valve requires are thus not determined by the length of the hydraulic cylinder, but only by its diameter, which is generally substantially less than its length.

BRIEF DESCRIPTION OF THE DRAWING

An example of the embodiment of the invention will now be explained with the aid of FIGS. 1 and 2.

FIG. 1 is a cross-sectional view taken through a coupling valve disposed between two chamber walls, and FIG. 2 is a partial cross section of the subject of FIG. 1 taken in a different plane.

DETAILED DESCRIPTION OF THE DRAWING

In FIG. 1 there is shown a stationary vacuum chamber 10 and a movable vacuum chamber 11, of which, however, only the chamber walls 12 and 13 are represented. A loading opening 14 is provided in chamber wall 12. Opposite this opening a mounting plate 15 is disposed in front of the chamber wall 13 and is joined hermetically to the chamber wall 13 by transverse walls 16. In the mounting plate 15 and in the chamber wall 13 there are loading openings 17 and 18, respectively, which openings are aligned with one another and can be brought into alignment with the loading opening 14 in the other vacuum chamber 10. On the left and/or right of the vacuum chamber 11, additional, identical vacuum chambers can be situated, whose similar loading openings can be aligned with the loading opening 14. When all of the loading openings 14 and 17/18 are in alignment, objects can be exchanged between the two vacuum chambers 10 and 11.

On the mounting plate 15 and hence on the chamber wall 13 there is mounted in a sturdy and vacuum-tight manner a frame 19 which by means of a resilient coupler 20 is movable with an additional frame 21, which is movable in relation to frame 19 parallel to the axis A—A and additionally in the direction of the arrow 22, in common with the vacuum chamber 11. The joining of the resilient coupler 20 to the frame 21 is accomplished by means of an intermediate frame 23 to which the resilient coupler is vulcanized the same as it is vulcanized to frame 19. Such couplings are also known under the name, "Metalastik."

The movable frame 21 is provided on its inside and outside periphery with two continuous seals 24 and 25 in the form of rings, for example. Between the seals is a circular groove 26 which communicates with an exhaust passage 27 which will be explained in detail in connection with FIG. 2. By producing a vacuum between the seals 24 and 25 and in the groove 26, a force is exercised by the atmospheric (or superatmospheric) pressure acting on the outer surface of the frame 21, which presses the chamber wall 12 and the frame 21 together in a vacuum-tight manner.

A plurality of actuators 28 distributed about the circumference of the frame 21 serve for its axial displacement, the essential part of the actuators in this case being a hydraulic cylinder 29. This cylinder is connected by a piston, which is not shown, and a piston rod 30 and a link 31 to a bell crank 32 which in turn acts through a link 33 on a push rod 34 which is affixed to the intermediate frame 23. The hydraulic cylinder 29 is fastened to the mounting plate 15 by means of a mounting bracket 35 which bears at its free end a bearing 36 for the bell crank 32. By virtue of the presence of the bell crank 32, the longitudinal axis and hence the direction of movement of the piston rod 30 is perpendicular to the axis A—A and hence perpendicular to the direction of movement of frame 21 in relation to the chamber wall 13. The frame 21 is pressed against the chamber wall 12 by a pull on all of the piston rods 30, and a pushing action of the rods will lift the frame 21 away from the chamber wall 12.

To the chamber wall 12 there is also fastened an additional, open frame 37 which surrounds the movable frame 21 in the manner of an edging, but leaves sufficient clearance to allow it to shift in the direction of arrow 22. The horizontal dimensions (in the direction of the arrow 22) of FIG. 1 have been represented as reduced. In practice, there will be at least one additional coupling valve within the frame 37, provided with the details represented in FIG. 1, both of them being movable within the frame 37 by at least the external dimension of frame 21. Frame 37 has on its farther edge from the chamber wall 12 a resilient gasket 38 whereby the frame is held against a bearing plate 39 surrounding the mounting plate 15. Within the frame 37 there is formed a chamber 40 in which a dry inert gas atmosphere can be produced under slight pressure through an inlet which is not shown.

FIG. 2 also indicates the manner in which the groove 26 in frame 21 can be evacuated. The exhaust passage 27 is brought through the intermediate frame 23 and communicates with an exhaust tube 41 which is connected to a vacuum pump which is not represented. For the purpose of lifting frame 21 away from the chamber wall 12, the groove 26 is filled with air through the exhaust tube 41. This reduces the amount of force that has to be exercised by the actuators.

Inside of the frame 19 there is also a shield 42 which is intended to prevent damage to the resilient coupler 20 through frame 19 from thermal radiation from objects which are to be passed from chamber to chamber.

What is claimed is:

1. Coupling valve for joining of stationary and movable evacuatable chambers having confronting chamber walls parallelly displaceable against one another comprising first frame means fastened to one chamber wall and joined by a resilient member to second movable frame means which can be brought into engagement with the other chamber wall, said movable frame being provided with at least one actuator means for moving the movable frame with respect to the fastened frame to press the movable frame against the confronting chamber wall.

2. Coupling valve of claim 1 wherein said movable frame has on its surface facing the confronting chamber wall at least two continuous sealing means between which there is an exhaust passage for providing a vacuum.

3. Coupling valve of claim 1 wherein said movable frame is surrounded by an additional open frame mean which spans in a substantially sealing manner the intermediate sapce between the two confronting chamber walls, and is of sufficient size to envelop the coupling valve in all possible positions.

4. Coupling valve of claim 1 wherein said actuator means includes a hydraulic cylinder with a piston and piston rod, said piston rod being approximately perpendicular to the direction of movement of said movable frame, and a bell crank means are disposed between the piston rod and said movable frame means for the transmission of force.

5. Coupling valve of claim 1 wherein a metal-to-elastomer joint is positioned between the first frame means and the movable frame means.

* * * * *